United States Patent [19]

Seki

[11] Patent Number: 5,034,336
[45] Date of Patent: Jul. 23, 1991

[54] METHOD OF PRODUCING INSULATED GATE BIPOLAR TRANISTOR

[75] Inventor: Yasukazu Seki, Kanagawa, Japan

[73] Assignee: Fuji Electric Co., Ltd., Kawasaki, Japan

[21] Appl. No.: 596,562

[22] Filed: Oct. 10, 1990

Related U.S. Application Data

[63] Continuation of Ser. No. 316,462, Feb. 27, 1989, abandoned.

[30] Foreign Application Priority Data

Mar. 3, 1988 [JP] Japan ................................ 63-50515

[51] Int. Cl.[5] .......................................... H01L 21/336
[52] U.S. Cl. .......................................... 437/29; 437/31;
437/40; 437/41; 437/233; 437/235; 437/247;
148/DIG. 126
[58] Field of Search .................... 437/29, 31, 90, 91,
437/191, 193, 228, 233, 44, 247; 148/DIG. 126;
357/23.4

[56] References Cited

U.S. PATENT DOCUMENTS

| | | | |
|---|---|---|---|
| 4,417,385 | 11/1983 | Temple | 437/29 |
| 4,430,792 | 2/1984 | Temple | 437/44 |
| 4,466,176 | 8/1984 | Temple | 437/44 |
| 4,680,853 | 7/1987 | Lidow et al. | 437/41 |
| 4,774,198 | 9/1988 | Contiero et al. | 437/29 |
| 4,810,665 | 3/1989 | Chang et al. | 437/41 |

FOREIGN PATENT DOCUMENTS 0008568  1/1987  Japan ................................ 437/44

*Primary Examiner*—Brian E. Hearn
*Assistant Examiner*—Tom Thomas
*Attorney, Agent, or Firm*—Brumbaugh, Graves, Donohue & Raymond

[57] ABSTRACT

The present invention relates to a method of producing an insulated gate bipolar transistor, of a vertical insulated gate field effect transistor. In the present invention a window portion is formed on a low-temperature oxide film and a polysilicon layer deposited on a polysilicon layer, which serves as a gate, and the ions of impurities are implanted while using these as a mask, thereby forming a P-base layer. The ions of impurities are then again implanted using this mask to form a P++ layer instead of using a conventional resist mask. Accordingly, in the present invention, the P++ layer is formed in self alignment with the edge of the polysilicon gate. Since there is no positional deviation due to inaccurate mask positioning which may be produced when a mask such as a resist is used, positional accuracy is enhanced which hereby eliminates latchup.

7 Claims, 3 Drawing Sheets

METHOD OF PRODUCING INSULATED GATE BIPOLAR TRANISTOR

This application is a continuation of application Ser. No. 07/316,462, filed on Feb. 27, 1989, now abandoned.

BACKGROUND OF THE INVENTION

The present invention relates to a method of producing an insulated gate bipolar transistor ("IGBT") or a vertical insulated gate field effect transistor.

FIG. 3 is a sectional view showing the structure of an IGBT having an N-type channel element. Such an IGBT includes a P+ substrate 1, a high-resistance N− layer 2, a P+ region 3, a P-type base layer 4, a high-impurity-density P++ layer 5, an N+ source region 6, a gate oxide film 7, a polycrystalline silicon gate 8, a PSG insulation layer 9, a source electrode 10, a gate electrode 11, and a drain electrode 12. The symbols S, G and D represent the terminals of a source, a gate and a drain, respectively.

As shown in FIG. 3, an IGBT fundamentally has a four-layer structure of PNPN although NPNP types can also be made. The operation thereof will now be explained with reference to an equivalent circuit shown in FIG. 4. In this circuit, a PNP transistor 13 and an NPN transistor are connected to each other as shown in FIG. 4, and has a resistance (Rp) 15. The transistor 14 is equivalent to an NPN parasitic transistor consisting of the N− layer 2, the P-type base layer 4 and the N+ layer 6 shown in FIG. 3. It is generally possible to control the main current by a gate 16, but if the resistance (Rp) 15 is large, a potential difference of more than a predetermined voltage is produced between the base and the emitter of the transistor 14, and a current flows between the collector and the emitter, thereby actuating the transistor 14. As a result, even after the gate 16 is cut off, the main current continues to flow, resulting in the breakage of the element itself. This phenomenon is called latchup. In order to actuate the IGBT normally, it is necessary to fabricate an element which does not cause latchup.

It is well known that the P++ layer 5 is formed to prevent latchup, as shown in FIG. 3. The P++ layer 5 is provided in order to reduce the resistance (Rp) 15 in FIG. 4, and to reduce the potential difference between both ends of the resistance 15 and lower the voltage between the emitter and the base, thereby preventing the parasitic transistor 14 from being actuated.

The operation of the P++ layer 5 will be explained in relation to the prevention of latchup with reference to FIG. 5, which is a partially enlarged view of the IGBT shown in FIG. 3. The same reference numerals are provided for the elements which are the same as those in FIG. 3. In FIG. 5, a channel is formed by induction in the base layer 4, specifically in the portion thereof indicated by the reference numeral 17 to connect the source region 6 and the high-resistance layer 2. The direction in which electrons flow through this channel is indicated with the arrow 18 of a solid line and the direction in which holes flow is indicated with the arrow 19 of a broken line. When holes flow along the route indicated by the arrow 19, a potential difference is produced by the resistance Rp at that time. In order to limit the potential difference to a low value, the high-density P++ layer 5 is preferably as close to the channel 17 as possible. The reference letters A, B, C and D in FIG. 5 represent various possible end positions of the P++ layer 5 for comparison. The merits and demerits of the positions will be described in the following.

For example, if the P++ layer is diffused to the position A, the channel 17 would be lost because the P++ layer 5 would surround the D source region 6, thereby making the operation of the MOS impossible. On the other hand, if the P++ layer is diffused only to the position D, since the holes 19 pass through the high-resistance P layer 4 for a longer time, the voltage drop is increased, so that latchup is apt to be produced. In addition, since a P+ well 3 is ordinarily formed, diffusion of the P++ layer 5 to the position D produces little effect. Diffusion of the P++ layer 5 to the position B is the most effective and ideal. However, controlling the diffusion so as to set the end of the P++ layer 5 at the position B is difficult and involves a fair possibility of diffusing the P++ layer 5 to the position A due to positional deviation produced by one cause or another. Thus it lacks in stability in the manufacturing process. For the above reasons, it is appropriate to diffuse the P++ layer 5 to the position C, i.e., substantially in alignment with the polysilicon gate 8, in order to prevent latchup. To realize this, in the present state of art, a mask such as a resist is generally used at the step of producing the P++ layer 5 in the fabrication of an IGBT.

As described above, it is important for preventing latchup to bring the high-density P++ layer as close to the position (2) in FIG. 5 as possible in the fabrication of an IGBT. It is therefore necessary to position a mask very accurately. The N+ source layer 6 is ordinarily formed by ion implantation with the polysilicon gate 8 as a mask, so that it is self aligned with the gate, thereby obtaining a good accuracy. However, when the P++ layer 5 is formed by using a different mask, it is necessary to compensate for deviation. Therefore, it is necessary to design the mask at a position closer to the position (4), which is behind the target position (3). In this way, the prior art, in which the P++ layer 5 is formed by diffusion using a mask, has various inconveniencies.

Accordingly, it is an object of the present invention to eliminate the above-described problems in the prior art and to provide a method of producing an IGBT with a good efficiency which prevents latchup by forming a high-impurity density P++ region by diffusion and self alignment without using a mask to define the outer boundaries of the region with a high accuracy in place of a conventional method in which the high-density P++ layer is formed by using a mask.

SUMMARY OF THE INVENTION

To overcome this problem, an electrical device is formed in accordance with the invention by the following steps:

(a) sequentially forming a semiconductor layer of the second conductivity type, a gate oxide layer, a polycrystalline semiconductor layer and an insulation layer on a semiconductor substrate of the first conductivity type;

(b) removing a part of said insulation layer to form a window through which a portion of said polycrystalline silicon is exposed;

(c) selectively removing the exposed portion of the polycrystalline silicon layer to leave a portion of the gate oxide layer exposed;

(d) introducing impurities through the window and the gate oxide layer into the semiconductor layer of the second conductivity type and then treating at high temperature to diffuse the impurities such that the base region is formed within that portion of the semiconductor layer of the second type which is aligned with the window;

(e) introducing further impurities through the window suitable for forming the high impurity density region;

(f) removing the remainder of the insulation layer;

(g) removing said gate oxide layer and forming a resist mask over a central part of the partially formed high impurity density region such that a gap exists between the mask and the polycrystalline material;

(h) introducing impurities through the gap suitable for forming the source region;

(i) removing the resist mask; and (j) thermally diffusing the impurities introduced in steps (e) and (h) to form the high impurity density region and the source region.

BRIEF DESCRIPTION OF THE DRAWINGS

For convenience of reference, like components, elements and features in the various figures are designated by the same reference numerals or characters.

DETAILED DESCRIPTION OF THE INVENTION

As described above, in an IGBT, a high-density $P++$ layer is provided in a P base layer in order to suppress the production of latchup phenomenon. In order to bring the effect to full play, it is necessary to enhance the positional accuracy of the $P++$ layer. In the present invention a window portion is formed on a low-temperature oxide film and a polysilicon layer deposited on a polysilicon layer, which serves as a gate, and the ions of impurities are implanted while using these as a mask, thereby forming a P base layer, and the ions of impurities are again implanted using this mask to form a $P++$ layer instead of using a conventional resist mask. Accordingly, in the present invention, the $P++$ layer is formed in self alignment with the edge of the polysilicon gate. Since there is no positional deviation due to inaccurate mask positioning which may be produced when a mask such as a resist is used, the positional accuracy is enhanced.

The present invention will be further explained with reference to the formation of a nonlimiting embodiment.

Figure 1A:
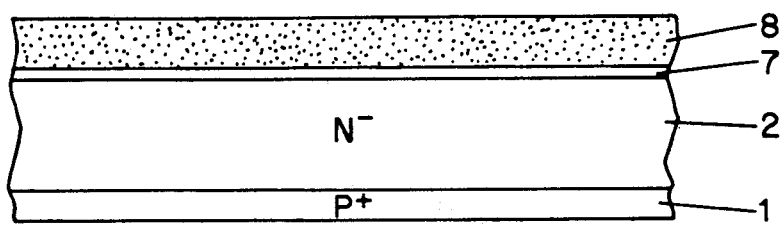
FIGS. 1 and 2 show the steps for producing an IGBT in accordance with the present invention.
Figure 1B:
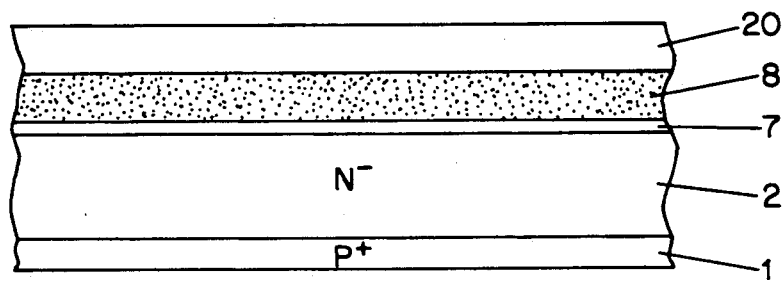
Figure 1C:
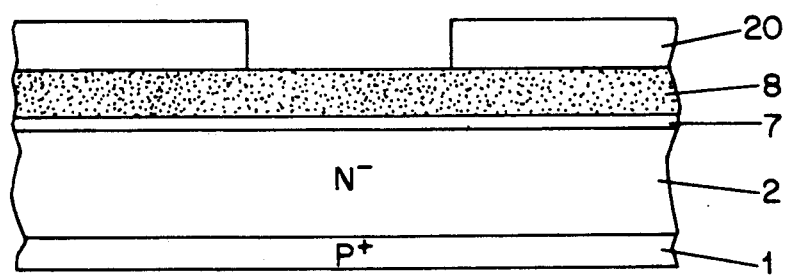
Figure 1D:
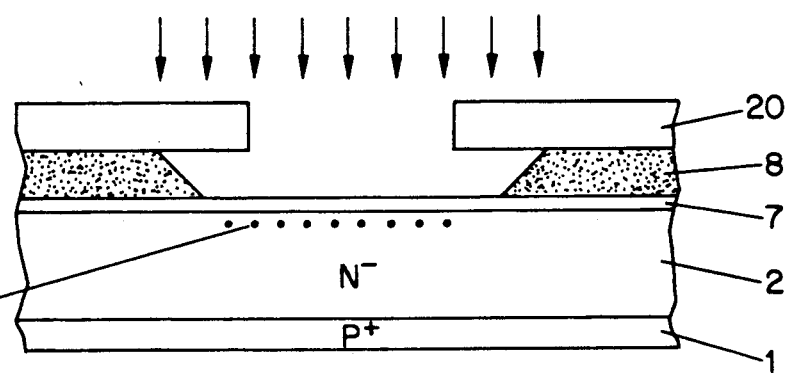
Figure 1E:
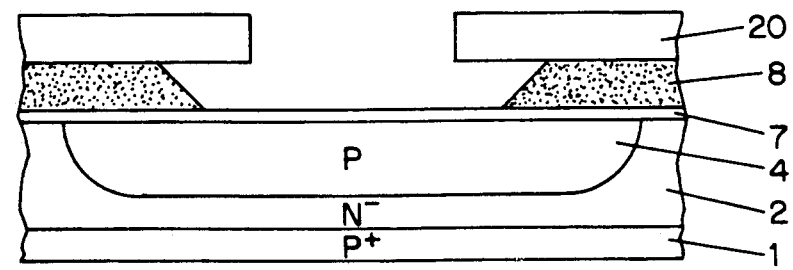
Figure 2F:
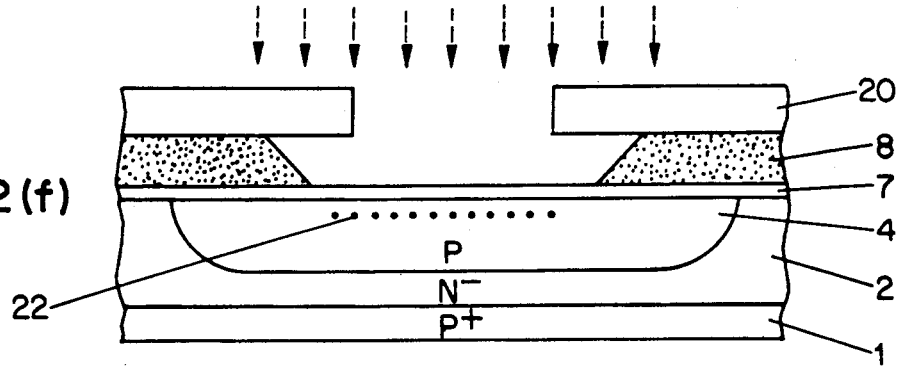
Figure 2G:
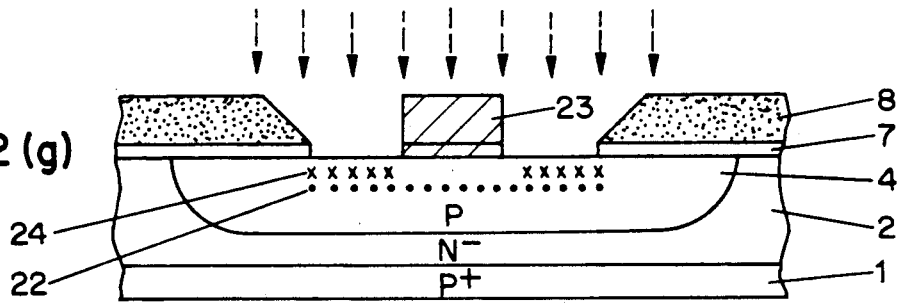
Figure 2H:
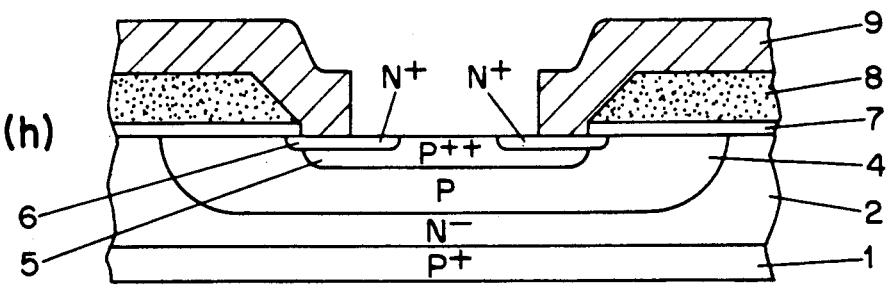
Figure 2I:
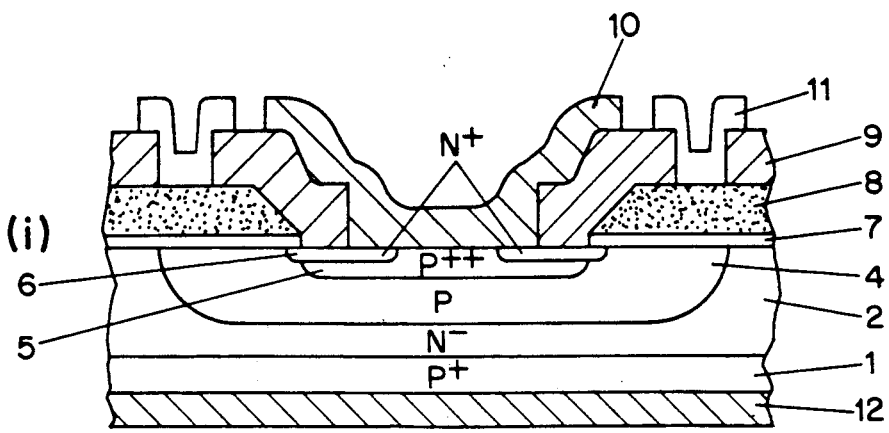
Figure 3:
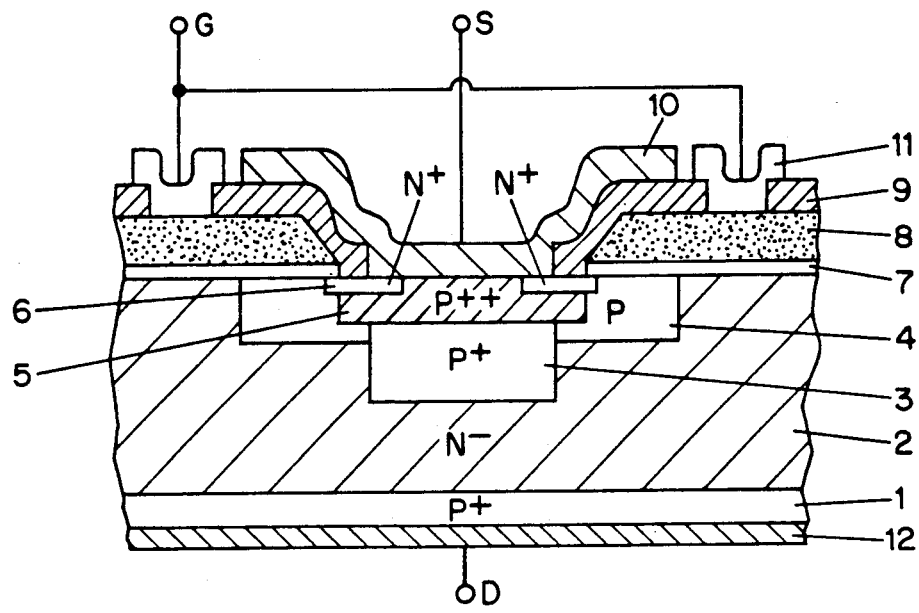
FIG. 3 is a sectional view of the structure of an IGBT.

FIGS. 1 and 2 shows the steps of the process in accordance with the present invention, wherein the same reference numerals are provided for those elements which are the same as those in FIG. 3. FIG. 1(a) shows the $P++$ substrate 1 with the high-resistance $N^-$ layer 2, the gate oxide film 7 and the polysilicon layer 3, which is to serve as a gate, formed thereon in that order. An oxide film 20 is formed as an insulation film on the polysilicon layer 8 at a low temperature such as about 380)C. (hereinunder this film is referred to as "LTO (low temperature oxidation film)"). This oxide film 20 may be an ordinary thermal oxidation film, but in the present invention, since high-temperature treatment is reduced as much as possible in order to avoid the production of crystallization deficiency or deviation of a juncture, an LTO is preferably used (FIG. 1(b)). The LTO 20 is partially removed to form a window portion by an ordinary photoetching process in which a resist is applied. As to the polysilicon layer 8 and the LTO 20, etching gas and etchant having a good selectivity are known in wet etching and dry etching, respectively, and selective etching is easy. For example, in wet etching of the LTO 20, a hydrofluoric acid etchant is used and in dry etching, $C_2F_6$ gas and $CHF_3$ gas are used (FIG. 1(c)). In this state, the etched LTO 20 acts as a mask for the subsequent etching of the polysilicon layer 8. Dry etching using $SF_6$ gas or $CF_4$ gas, which has a good selectivity between the oxide film and polysilicon, is preferably adopted. In this embodiment, dry etching using $SF_6$ gas, which enables isotropic etching of the polysilicon layer 8, is illustrated in FIG. 1(d). In this state, boron ions are implanted while using the LTO 20 as a mask. The ion implantation is indicated with the arrows and the implanted boron ions are represented by the reference numeral 21. The implanted boron 21 is diffused by driving, thereby forming the P base layer 4 (FIG. 1(e)). Thereafter, additional boron ions are implanted for forming the high-impurity-density $P++$ layer. The ion implantation is indicated with the arrows, and the implanted boron ions are represented by reference numeral 22 (FIG. 2(f)), as in FIG. 1(d). The LTO 20 and the gate oxide film 7 is then removed by etching, and a resist 23 is applied leaving a gap between the resist 23 and the edges of the polycrystalline layer 8. Arsenic ions are implanted through this gap using the resist 23 and the polysilicon layer 8 as a mask as indicated with the arrows of broken lines. The reference numeral 24 represents the implanted arsenic. Because of the use of the semiconductor layer rather than the insulator window to define the arsenic ion implantation region, there is a difference in the edge positions between the implanted boron 22 and arsenic 24 impurities. The implantation of arsenic ions 24 is for the purpose of forming the $N^+$ source layer 6. Although phosphorus may be used in place of arsenic, the $N^+$ source layer 6 is preferably shallower than the high impurity density $P++$ layers in order to prevent latchup, so that it is preferable in the present invention to use arsenic, which has a smaller diffusion coefficient than phosphorus (FIG. 2(g)). Thereafter, the resist 23 is removed and the PSG insulation layer 9 is formed. High-temperature treatment applied to the reflow process of the PSG insulation layer 9 activates and diffuses the implanted boron 22 and arsenic 24. The thus-obtained diffusion layers constitute the high-impurity-density $P++$ layer 5 and the $N^+$ source layer 6, respectively. (FIG. 2(h)). Finally, the source electrode 10, the gate electrode 11 and the drain electrode 12 are provided by deposition or the like of a conductive metal. Thus, an insulated gate bipolar transistor having the structure similar to that shown in FIG. 3 is obtained (FIG. 2(i)). The $P++$ layer 3 shown in FIG. 3 is omitted in FIGS. 1 (a) to (e) and 2 (f) to (i).

As described in the above method of producing an IGBT according to the present invention, since the high-impurity-density $P++$ layer 5 is formed with high positional accuracy by self alignment, it the $N++$ source layer 6 are possible to suppress the latchup of the IGBT obtained.

Additionally, an IGBT and a power MOSFET have substantially the same fundamental element structure in spite of a difference in detailed dimensions. The two MOSFETs are distinguished from each other depending upon whether they have on the drain side a region of an opposite conductivity type to that of the source. Therefore, the method of the present invention is naturally applicable to a power MOSFET. Further, it will be understood that conductivity types might be readily reversed by changing the nature of the impurity in each layer.

Figure 4:
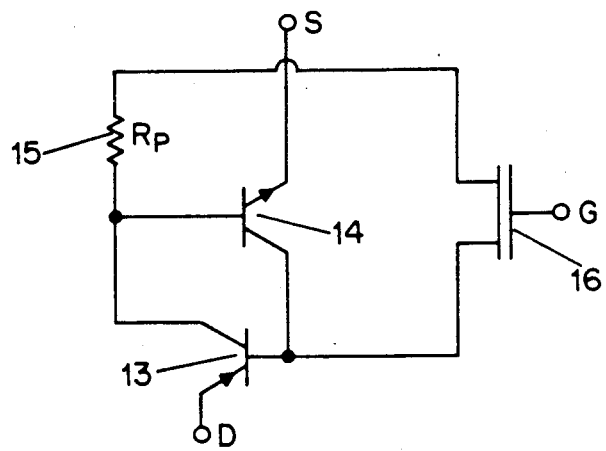
FIG. 4 shows an equivalent circuit of an IGBT.
Figure 5:
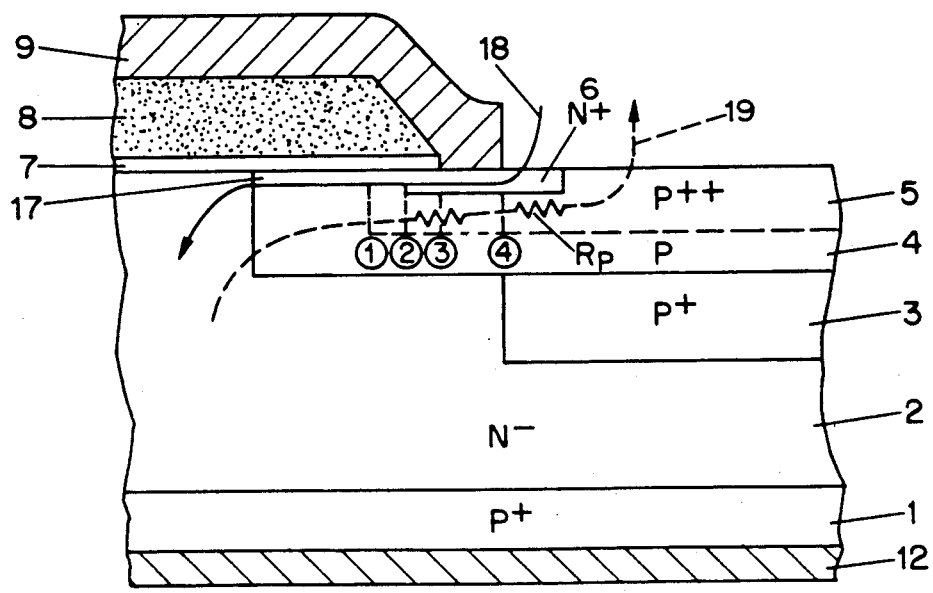
FIG. 5 is an enlarged view of the channel forming portion and the vicinity of the IGBT shown in FIG. 3.

When an IGBT is produced, a photomask is conventionally used for forming a high-impurity-density P++ layer in order to prevent latchup. In the present invention, however, as described in the embodiment, it is possible to form the P++ layer at an effective position in the P base layer with a high accuracy by self alignment using an LTO. In addition, since a photomask and, hence, the photoetching process, are dispensed with, not only is the fabricating laccuracy improved but also the manufacturing process is simplified. Furthermore, while the N+ source layer is conventionally formed by etching the oxide film and the gate oxide film provided by high-temperature driving to an appropriate thickness and implanting arsenic ions while using the remaining oxide film as a screen, the method of the present invention removes the oxide film before arsenic ions are implanted. As a result, the leak current of the parasitic transistor 14 shown in FIG. 4 is larger due to the damage of the P base layer by arsenic ion bombardment than in the prior art and, with the reduced potential difference, it is possible to produce an IGBT which is unlikely to produce latchup.

I claim:

1. A method for forming an electrical device comprising a semiconductor substrate of a first conductivity type having disposed thereon a transistor element, said transistor element comprising a layer of a high resistance semiconductor material of a second conductivity type different from said first conductivity type, a base region of said first conductivity type embedded within said layer of high resistance semiconductor material and extending to a first major surface of the transistor element, a high-impurity density region of the first conductivity type embedded within the base region and extending to the first major surface of the transistor element, and a source region of the second conductivity type embedded at the interface between the base region and the high impurity density region and extending to the first major surface of the transistor element, whereby the first major surface of the transistor element has the high impurity density region, surrounded by the source region, surrounded by the base region, surrounded by the high resistance semiconductor material, and the second major surface of the transistor element which is disposed toward the substrate is entirely high resistance semiconductor material, and a gate oxide layer and a polycrystalline semiconductor layer, each disposed over all of the base region and high resistance semiconductor material portions of the first major surface of the transistor element but not over the high impurity density portions of the transistor element, comprising, in sequence, the steps of:

(a) sequentially forming a semiconductor layer of the second conductivity type, a gate oxide layer, a polycrystalline semiconductor layer and an insulation layer on a semiconductor substrate of the first conductivity type;

(b) removing a part of said insulation layer to form a window through which a portion of said polycrystalline silicon is exposed;

(c) selectively removing the exposed portion of the polycrystalline silicon layer to leave a portion of the gate oxide layer exposed, said exposed portion of the gate oxide layer being larger than the window defined by the insulation layer;

(d) introducing impurities through the window defined by the insulation layer and the gate oxide layer into the semiconductor layer of the second conductivity type and then treating at high temperature to diffuse the impurities to form a base region within the semiconductor layer of the second type;

(e) introducing further impurities suitable for forming the high impurity density region of the first conductivity type through the window defined by the insulating layer and the gate oxide layer to form an undiffused high impurity density region within the base region;

(f) removing the insulation layer remaining after stem (b);

(g) removing the exposed portion of the gate oxide layer and forming a resist mask over a central part of the undiffused high impurity density region such that a gap exists between the mask and the polycrystalline material;

(h) introducing impurities suitable for forming the source region of the second conductivity type through the gap;

(i) removing the resist mask; and (j) thermally diffusing the impurities introduced in steps (e) and (h) to form the high impurity density region and the source region.

2. A method according to claim 1, wherein said insulation layer is a low temperature oxide film.

3. A method according to claim 1, wherein the device is an insulated gate bipolar transistor.

4. A method according to claim 1, wherein the device is a power metal-oxide semiconductor field effect transistor.

5. A method according to claim 1 further comprising the step of forming an insulating layer over the transistor element after removing the resist mask.

6. A method according to claim 5 further comprising forming source, gate and drain electrodes.

7. A method according to claim 5, wherein the insulating layer is applied before thermally diffusing the impurities introduced in steps (e) and (h), and wherein heat is applied to simultaneously reflow the insulating layer and diffuse the impurities.

* * * * *

UNITED STATES PATENT AND TRADEMARK OFFICE
CERTIFICATE OF CORRECTION

PATENT NO. : 5,034,336

DATED : July 23, 1991

INVENTOR(S) : Yasukazu Seki

It is certified that error appears in the above-identified patent and that said Letters Patent is hereby corrected as shown below:

On the title page, col.1, line 3, Item [54] , "TRANISTOR" should read --TRANSISTOR--;

Column 4, line 62, "is" should read --and the $N^{++}$ source layer 6 are--;

Column 4, line 63-64, "the $N^{++}$ source layer 6 are" should read --is--;

Column 5, line 49, "has the" should read --has a--;

Column 5, line 50, "by the" should read --by a--;

Column 5, line 51, "by the" should read --by a--;

Column 5, line 52, "the high" should read --high--;

UNITED STATES PATENT AND TRADEMARK OFFICE
CERTIFICATE OF CORRECTION

PATENT NO. : 5,034,336

DATED : July 23, 1991

INVENTOR(S) : Yasukazu Seki

It is certified that error appears in the above-identified patent and that said Letters Patent is hereby corrected as shown below:

```
Column 6, line 23, "the high" should read --a high--;
Column 6, line 28, "stem" should read --step--;
Column 6, line 35, "forming the" should read --forming a--;
Column 6, line 43, "oxide film" should read --oxidization film--.
```

Signed and Sealed this

Twentieth Day of April, 1993

Attest:

MICHAEL K. KIRK

*Attesting Officer*      *Acting Commissioner of Patents and Trademarks*